(12) United States Patent
Binnard et al.

(10) Patent No.: US 6,927,505 B2
(45) Date of Patent: Aug. 9, 2005

(54) FOLLOWING STAGE PLANAR MOTOR

(75) Inventors: Michael Binnard, Belmont, CA (US); Bausan Yuan, San Jose, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/021,053

(22) Filed: Dec. 19, 2001

(65) Prior Publication Data

US 2003/0111912 A1 Jun. 19, 2003

(51) Int. Cl.[7] .............................................. H02K 41/10
(52) U.S. Cl. .............................. 310/12; 310/13; 310/15
(58) Field of Search ................................ 310/12, 13, 15

(56) References Cited

U.S. PATENT DOCUMENTS

| | | | | |
|---|---|---|---|---|
| 5,648,690 A | * | 7/1997 | Hind | 310/12 |
| 5,763,965 A | * | 6/1998 | Bader | 310/12 |
| 5,815,246 A | | 9/1998 | Sperling et al. | |
| 5,969,441 A | | 10/1999 | Loopstra et al. | |
| 6,215,206 B1 | * | 4/2001 | Chitayat | 310/12 |
| 6,262,796 B1 | | 7/2001 | Loopstra et al. | |
| 6,552,449 B2 | * | 4/2003 | Tsuboi | 310/12 |

FOREIGN PATENT DOCUMENTS

| | | |
|---|---|---|
| JP | 2000-106340 | 4/2000 |
| WO | WO 01/18944 A1 | 3/2001 |

* cited by examiner

Primary Examiner—Darren Schuberg
Assistant Examiner—Iraj A. Mohandesi
(74) Attorney, Agent, or Firm—Greenblum & Bernstein, P.L.C.

(57) ABSTRACT

In electric motor assemblies, separating the x and y coils may achieve significant advantages. An advantageous design includes pairs of interacting magnet array/coil arrays. Separated coil arrays are provided, with a coil array on an arm connected to a following stage, and another coil array on a stage base (the stage being one to which is attached magnet arrays). Positioning devices, moving magnet motor assemblies, moving coil motor assemblies, and methods of driving a stage are provided. By differential driving and creation of torques about the x and y axes, a stage may be driven in six independent degrees of freedom.

16 Claims, 10 Drawing Sheets

FOLLOWING STAGE PLANAR MOTOR

BACKGROUND OF THE INVENTION

1. Technical Field

This invention relates generally to electric motors and more particularly to two-dimensional electric motors.

2. Background Art

Electric motors are used in a variety of electrical equipment. For example, linear electric motors produce electrical power propelling an armature in one dimension. Wafer stages use linear electric motors to position a wafer during photolithography and other semiconductor processing.

A typical one-dimensional linear electric motor has a magnet track with pairs of opposing magnets facing each other. Within spaces between the pairs of opposing magnets, an armature moves. The armature has windings of a conductor which are connected to an electrical current. When the electrical current is turned on, the electric current interacts with the magnetic fields of the magnet pairs to exert force on the armature, causing the armature to move. When the armature is attached to a wafer stage, the wafer stage experiences the same force as and moves in concert with the armature.

In a multiphase motor, the armature has various windings grouped into phases. The electric currents are selectively applied to the phase groups to create a more efficient motor. As the armature moves within the magnet track as current is applied to a first group of coils, the first group moves out of its optimal position between the pairs of magnets. Then, it becomes more efficient to apply current to a second group of windings. More phase groups are theoretically more efficient since a more even application of force and use of power input is maintained. However, each additional phase group complicates timing of the applied current to the various phase groups. Presently, three-phase motors and armatures have gained favor in balancing these considerations.

Linear two-dimensional motors also are used in manufacturing. (U.S. Pat. No. 4,654,571, entitled "Single Plane Orthogonally Moveable Drive System," issued to Hinds on Mar. 31, 1987 ("Hinds") and U.S. Pat. No. 4,535,278, entitled "Two-Dimensional Precise Positioning Device for Use in a Semiconductor Manufacturing Apparatus," issued to Asakawa on Aug. 13, 1985 discuss two-dimensional linear electric motors and are incorporated herein by reference in their entireties.) The motors are two-dimensional in that they have two-dimensional arrays of magnets and armatures instead of magnet tracks and one-dimensional armatures. However, the magnet arrays and two-dimensional armatures may move with respect to each other in more than two dimensions depending upon the design. Conventional two-dimensional linear motors typically have an array of magnets and an armature having one or more coils on one side of the array of magnets.

U.S. Pat. No. 5,623,853, entitled "Precision Motion Stage with Single Guide Beam and Follower Stage," issued to Novak et al. on Apr. 29, 1997 and U.S. Pat. No. 5,528,118, entitled "Guideless Stage with Isolated Reaction Stage," issued to Lee on Jun. 18, 1996 discuss examples of semiconductor fabrication equipment and are incorporated herein by reference in their entireties.

When attached to part of a two-dimensional linear motor, a platform can be moved in two or more dimensions by the motor. For example, a wafer stage in semiconductor processing equipment may be attached to an armature or magnet array of a two-dimensional motor and the two-dimensional motor would control positioning of the wafer stage.

When used to position a platform, conventional two-dimensional electric motors do not smoothly and accurately position the platform. Presently, coils in the two-dimensional electric motors move with respect to the magnets. As exemplified in U.S. Pat. No. 4,654,571, entitled "Single Plane Orthogonally Moveable Drive System" issued to Hinds on Mar. 31, 1987, referenced above and incorporated herein by reference in its entirety, cables and hoses are attached to the coil assembly. The cables are for electrical current and the hoses may be used to carry coil cooling fluid or air supply. Unfortunately, the hoses and cables impede free motion of the coil assembly. If the hoses could be eliminated, the stability of motion of the motor and positioning of the platform would be improved.

Also, in many cases conventional technology relies upon cumbersome stacked arrangements to achieve six degrees of freedom movement of the platform. The six degrees of freedom include three translational and three rotational degrees of freedom. (Richard P. Feynman, Robert B. Leighton, and Matthew Sands, *The Feynman Lectures on Physics*, Addison-Wesley, 1962, discusses translational and rotational motion and degrees of freedom and is incorporated herein by reference in its entirety.) Unfortunately, many designs obtain six degrees of freedom by essentially stacking multiple two dimensional and/or one dimensional motors which move only in two dimensions within a plane. (U.S. Pat. No. 5,623,853, entitled "Precision Motion Stage with Single Guide Beam and Follower Stage" issued to Novak et al. on Apr. 29, 1997, discusses examples of such stacked arrangements and is incorporated herein by reference in its entirety.) For example, a platform may be propelled back and forth in one dimension under the control of linear electric motors. The linear electric motors are part of a holder which holds the platform. In turn, a second holder holds that entire holder and platform arrangement via joint connections and propels it back and forth in a second dimension by another set of linear electric motors. Additional degrees of motion may be provided by voice coil motors which are attached to these holders.

These types of stacked arrangements have a few drawbacks. Each additional holder enabling more degrees of freedom also adds mass requiring additional power for the electric motors to move the platform. Also, the complicated joint connections degrade accuracy of positioning of the platform and create additional resonant vibration frequencies.

Recognizing that the platforms could benefit from a better electric motor to position them, such as an improved electric motor that would eliminate the air hoses and position the platform in multiple degrees of freedom without the cumbersome stacked arrangements, U.S. Pat. No. 6,208,045 issued Mar. 27, 2001 to Hazelton et al. provided a basic planar motor. Planar stage motors generally provide a wafer stage directly on a base, with the motor acting directly on the stage. Another example of a planar motor is that of U.S. Pat. No. 4,654,571, mentioned above (Hinds), that uses a single motor to control motion in three or six degrees of freedom. U.S. Pat. Nos. 5,196,745 and 3,851,196 exemplify planar stage motors, particularly, planar stage motors that use multiple linear motors to achieve motion in three or six degrees of freedom. U.S. Pat. No. 5,334,892 exemplifies a planar motor that can use either a checkerboard magnet array, or separate linear motor magnet arrays.

Compared to stacked designs, planar stage motor designs eliminate mass, such as eliminating guide bar mass and "y"

linear motor mass. However, planar stage motors could be improved and made more sophisticated, such as by better incorporating the advantages of stacked arrangements while avoiding re-introduction of the disadvantages of stacked designs.

In summary, the conventional planar motors using a single actuator to produce forces in both the x and y directions, typically using a checkerboard magnet array, have several drawbacks. First, at most 50% of the armature area can be used to generate force in the x or y direction (assuming the motor's performance in x and y are equal), because the remaining area is needed for the other axis. Second, these single actuator designs often result in coupling between forces in different directions. For example, in the motor in U.S. Pat. No. 6,208,045, each coil produces force in the x, y and z directions. Because of the different forces produced by multiple coils, proper commutation permits independent control of force in each direction. For example, to produce x force only, the currents in a group of coils can be commutated so that the y and z force components cancel each other. However, because of manufacturing variations, changes in the magnetic gap, and other disturbances, the forces produced by each coil do not exactly match theory. Therefore, producing force in the x direction will lead to some force ripple in y and z. Also, the effects of cross-axis force ripple limit the planar motor's ability to precisely control the position of the stage. As a result, lithography machines that use these designs would require a stage that uses the planar motor for coarse positioning, and carries a high-precision fine-stage for precise position control.

Conventional linear motors have not resolved these problems of single actuator motor designs. Designs that use distinct linear motors, such as those of U.S. Pat. Nos. 5,196,745 and 3,851,196, have a limited range of motion. Linear motors that address this problem with limited range of motion have the drawback of requiring motor structure on both sides of the stage. Often the parts of the motor on the top of the stage interfere with other sensors or equipment. Also, such a design requires a relatively large stage. These various disadvantages of conventional linear motors detract from their efficiency, performance and usefulness.

SUMMARY OF THE INVENTION

The present invention seeks to provide a planar stage motor that exploits advantageous features of conventional stacked designs while eliminating disadvantages that conventionally accompanied such stacked designs. The invention provides a six-degree-of-freedom planar motor that uses a following stage. A purpose of the invention is to control the position of a wafer stage, or other object, in all six degrees of freedom. The present invention uses linear motors to achieve planar motion of a stage with a large range of motion. Because a following stage may be used to carry the stator part of the linear motors for one axis, a large range of motion is possible with a relatively compact stage.

To provide such advantageous features, the invention in a first preferred embodiment provides a stage assembly, comprising: a first motor that includes a first part and a second part, the first motor producing a first force; a second motor that includes a first part and a second part, the second motor producing a second force; a base to which the first part of the first motor is attached; a stage to which is attached the second part of the first motor and the second part of the second motor, the stage moving relative to the base by at least one of the first force and the second force; and a second stage to which the first part of the second motor is attached, wherein the base and the second stage are different respective bodies.

In another preferred embodiment, the invention provides a stage assembly comprising: a first motor that includes a first part and a second part, the first motor producing a first force; a second motor that includes a first part and a second part, the second motor producing a second force; a base to which the first part of the first motor is attached; a stage to which is attached the second part of the first motor and the second part of the second motor, the stage moving relative to the base by at least one of the first force and the second force; and the first part of the second motor being attached to a second body that is different from the base.

Additionally, a third preferred embodiment of the invention provides a method for driving a stage, comprising: driving the stage by (a) a first force produced by a first motor including a first part and a second part that interacts with the first part; and (b) a second force produced by a second motor including a first part and a second part that interacts with the first part of the second motor, with the first part of the first motor and the first part of the second motor being separate, wherein the first part of the first motor is attached to a base that supports the stage and the first part of the second motor is attached to a different body from the base.

A fourth preferred embodiment of the invention provides an exposure apparatus comprising: an illumination system that irradiates radiant energy; and an apparatus comprising: a first motor that includes a first part and a second part, the first motor producing a first force; a second motor that includes a first part and a second part, the second motor producing a second force; a base to which the first part of the first motor is attached; a stage to which is attached the second part of the first motor and the second part of the second motor, the stage moving relative to the base by at least one of the first force and the second force; and a second stage to which the first part of the second motor is attached, wherein the base and the second stage are different respective bodies; the apparatus disposing an object on a path of the radiant energy.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
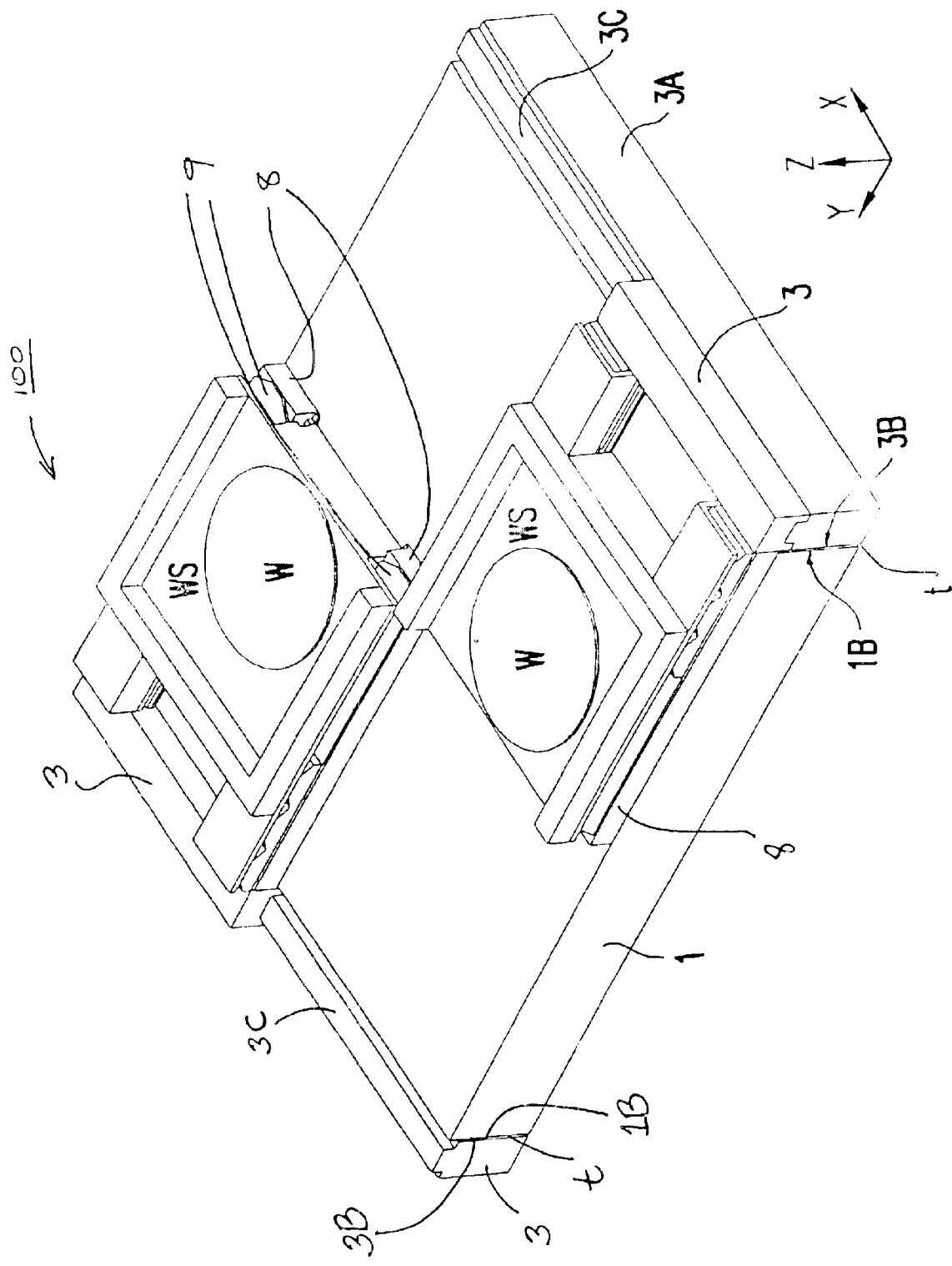
FIG. 1 is a perspective view of a motor assembly, with two wafer stages, according to the invention in a moving-magnet embodiment.

Referring now to the drawings, and more particularly to FIGS. 1 through 4, a motor assembly of an exemplary form in accordance with a preferred embodiment of the invention is shown. FIGS. 1 through 4 show a moving-magnet embodiment.

Figure 4:
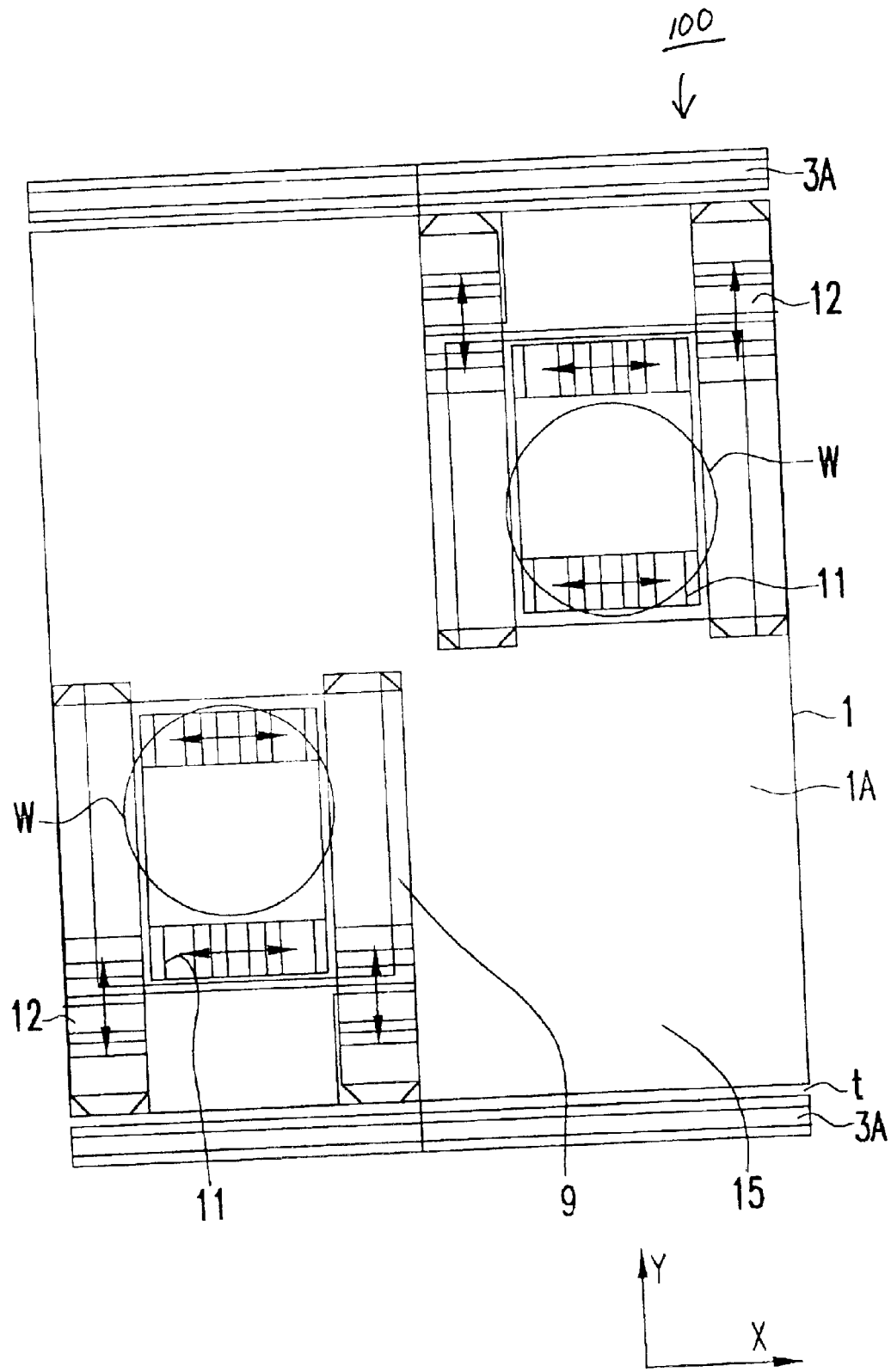
FIG. 4 is a top view of a motor assembly according to the invention in a moving-magnet embodiment.

The motor assembly shown in FIG. 1 depicts two wafer stages, WS on each of which is respectively positioned wafer W. As shown in FIGS. 1 and 4, the invention allows a lithography machine to use two wafer stages WS to increase throughput. It will be appreciated that the two wafer stages may be the same or different, and that the number of wafer stages is not required to be two, and may be one, three, four, etc.

Figure 2A:
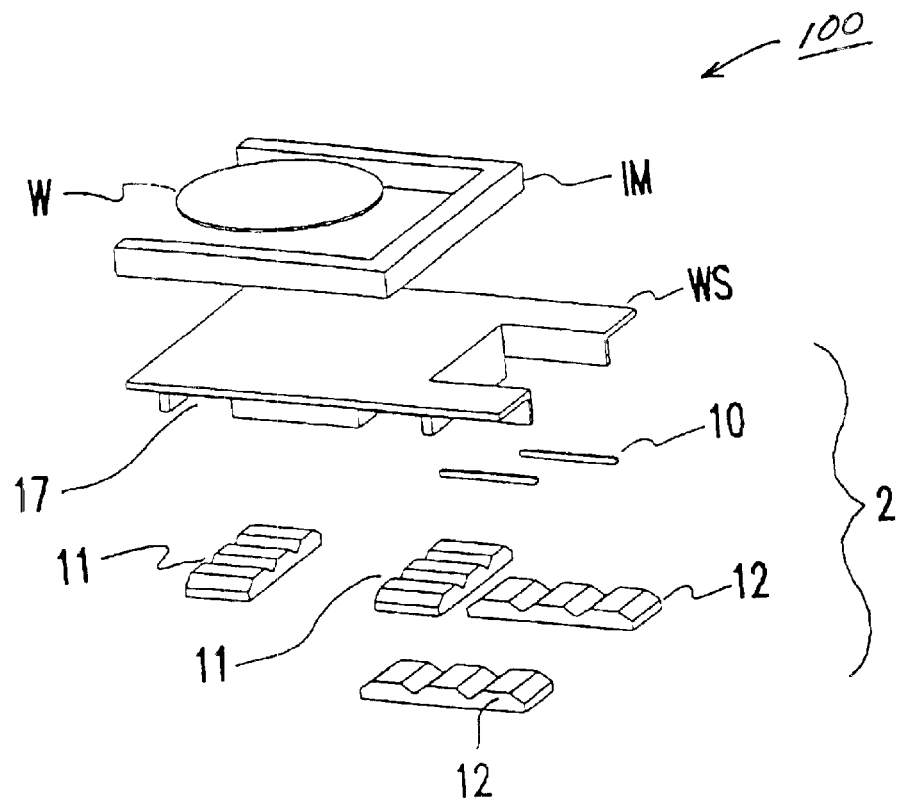
FIG. 2A is an exploded view of a motor assembly according to the invention in a moving-magnet embodiment.
Figure 2A:
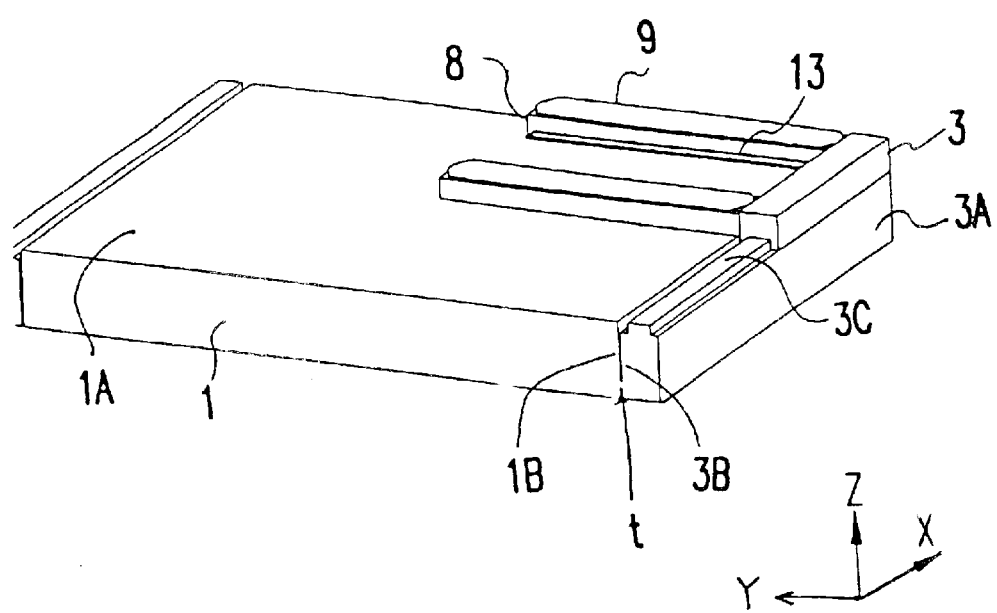

In FIGS. 1 and 2, a base 1 is provided. The base 1 is suitable for housing a motor that acts between the base 1 and stage WS to move the stage WS in the "x" direction, such as motor 2 in FIG. 2A. (It will be appreciated that x, y and z directions are labeled on the figures and discussed herein for convenience of reference and easy discussion only.) An example of a suitable motor is the motor 2 in FIG. 2A that comprises levitation magnets 10, x magnets 11 and y magnets 12. The stage WS is moved by an x motor in the x direction (first direction). The x motor comprises x coils 5 and x magnets 11 and produces forces in the x direction by utilizing a Lorentz force. Each x motor can produce forces in the Z direction. The stage WS is moved by a pair of y motors in the y direction (second direction). Each y motor comprises y coils 9 and y magnets 12 and produces forces in the y direction by utilizing a Lorentz force. Further, each y motor can produce forces in the Z direction.

The apparatus of also provides a following stage 3 such as stage 3 in FIG. 2A. The following stage 3 may be moved by a linear motor or linear motors. Linear motor technology suitable for moving the following stage 3 is well known to those skilled in the art. In the following stage 3 shown in FIG. 2A, movement in the x direction is provided. (However, it will be appreciated that in other embodiments of the invention, other following stage movements or motorized arrangements may be provided.) As shown in FIG. 2A, the following stage 3 comprises a following stage base edge 3B that parallels base edge 1B. The following stage edge 3B of the following stage base 3A and the base edge 1B of the stage base 1 are not permanently joined, and there is a gap t between parallel edges 3B and 1B. The gap t may remain constant in operation, such as the base 1 and following stage base 3A remaining stationary with the following stage 3 being capable of moving. There is no particular minimum or maximum distance for gap t, but generally a relatively small t (i.e., the following stage is near the base) is preferred.

It further will be appreciated that the base 1 and following stage 3 are not required to maintain constant gap t, i.e., the base 1 and the following stage base 3A may move relative to each other. When movement is permitted between the base 1 and the following stage base 3A (i.e., when a variable t is provided during operation), a shock absorber may be provided between each base 1 and 3A and the ground G (shown in FIG. 3). By such an arrangement of providing a shock absorber between the base 1 and the ground G (shown in FIG. 3), the base 1 moves relatively slightly in the x direction, and the following stage base 3A moves relatively slightly in the y direction, and as a result vibrations that otherwise would transmit to the floor are advantageously filtered.

The aspect of operation of the apparatus in which the following stage 3 moves in the x-direction while the following stage base 3A remains stationary may be further appreciated by reference, for example, to FIGS. 1 and 2(a). The following stage 3 is moveable in the x-direction of the apparatus with respect to the following stage base 3A, Such moveability of the following stage 3 may be provided by providing the following stage base 3A with a track top surface 3C that interlocks with a grooved opening in the bottom of the following stage 3. It will be appreciated that such a track arrangement as shown in the figures is by way of non-limiting example, and that x-direction moveability of the following stage 3 with respect to the following stage base 3A may be provided by alternate arrangements.

Figure 2B:
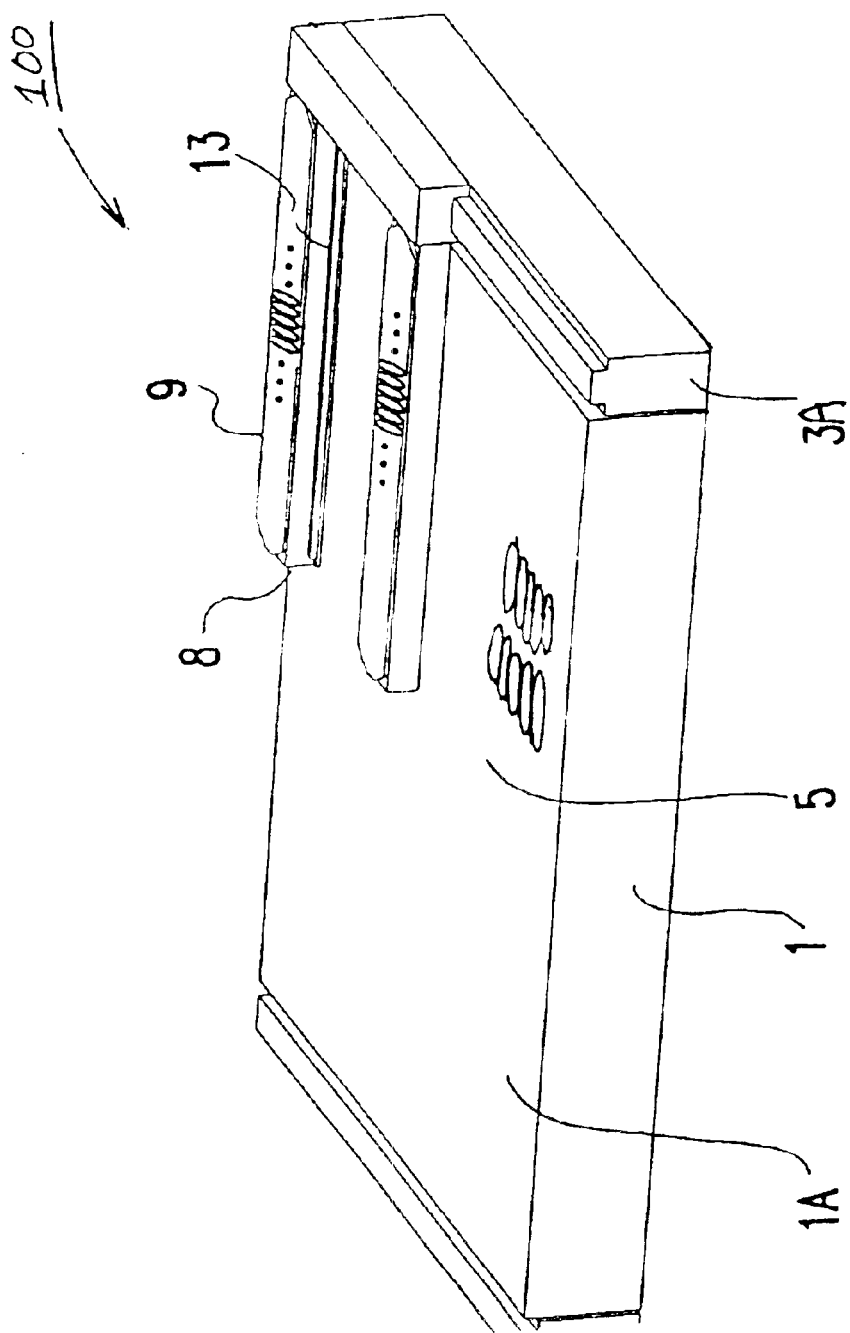
FIG. 2B is a view of the base and following stage according to FIG. 2A showing detail of the base and following stage surfaces.

As FIGS. 2(a) and 2(b) show, a top surface (guide surface for the stage WS) 1A of the base 1 has the x-coils 5 that interact with the x magnets (permanent magnets) 11 on the underside of the stage WS to produce forces in the x direction (and also in the z direction). The magnets 11 may be placed in slots 17 on the underside of the stage WS. The x-coils 5 may be embedded on the top surface 1A of the base 1. The x-coils preferably cover (but are not required to cover) the surface 1A. As shown in FIG. 2(b), the x-coils 5 preferably are arranged in rows along the x-direction. The x-coils 5 may be exposed as shown in FIG. 2(b). Alternately, the x-coils 5 may be covered by a smooth, flat sheet that acts as a bearing surface for air bearings on the bottom of the following stage 3 (such as air bearings shown on FIG. 3). The bottom surface of arms 8 may directly contact the top of the x-coils 5 or the bearing surface, with a suitable bearing (e.g., an air bearing) therebetween to allow movement of the arms 8. The bottom surface of the arms 8 is not required to be in direct contact with the top of the x-coils 5 or the bearing surface, and there may be a gap therebetween.

Figure 3:
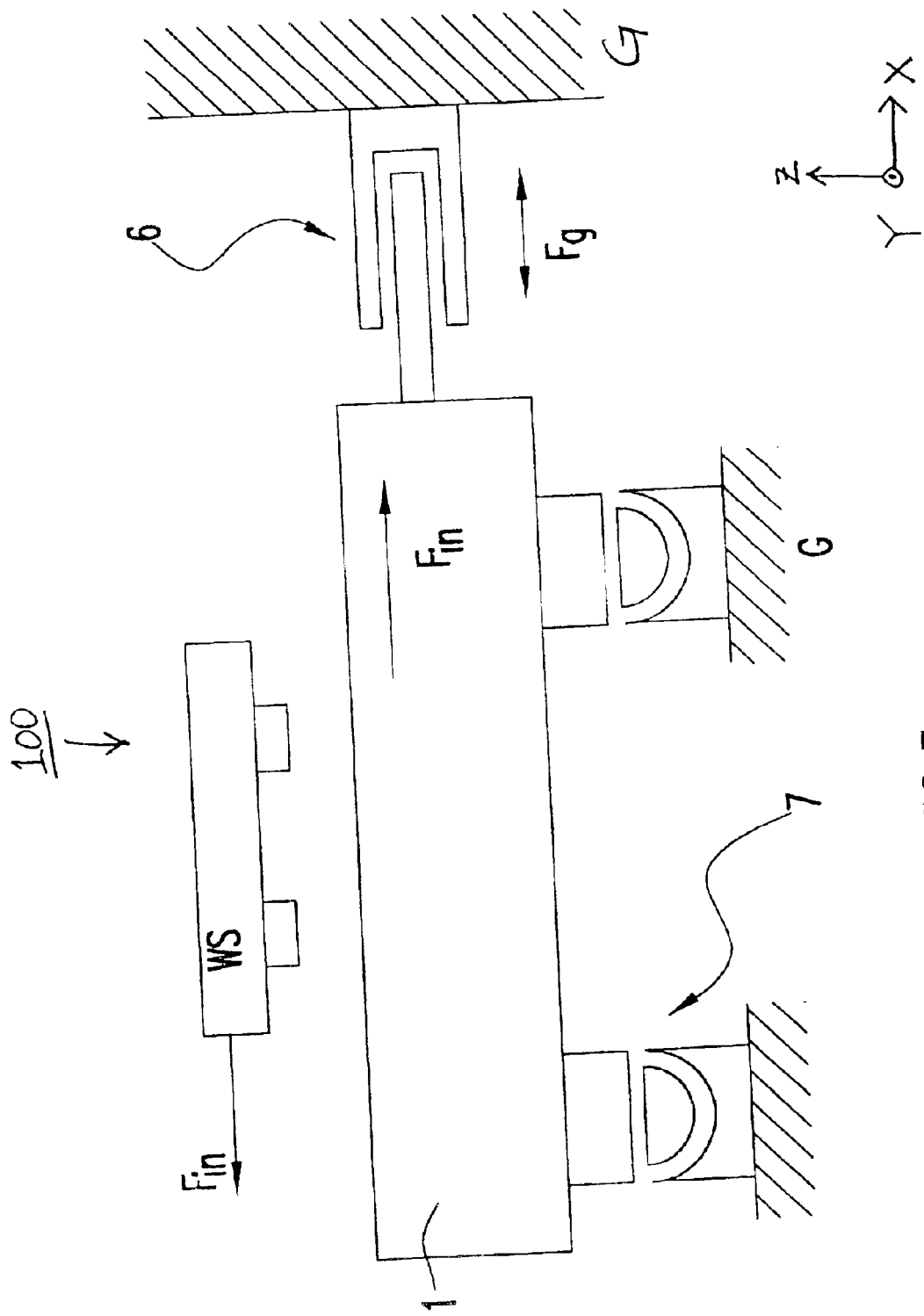
FIG. 3 is a cross-sectional view of a motor assembly according to the invention in a moving-magnet embodiment.

The base 1 may be supported, such as by a flexure(s) or air bearings (such as gimbal air bearing 7 in FIG. 3), in a way that allows it to move a small amount in the x direction. In this way, when the x-coils 5 provide a force in the x-direction (see <$F_{in}$ on FIG. 3) to move the stage WS, the reaction force ($F_{in}$>) will move the base 1 in the opposite direction. Referring to FIG. 3, because the base 1 (an example of which is a 500 kg base) is much more massive than the stage WS (an example of which is a 50 kg stage), the motion of the base 1 will be small. An additional actuator (such as a linear motor 6 as shown in FIG. 3 or a passive spring-damper device) connected between the base 1 and ground G or a reaction frame (not shown) may be used to slowly and controllably return the base 1 to its original position, with the force being exerted shown as $F_g$. In this way, the amplitude of forces transmitted to the ground G is desirably reduced. This reaction-mass concept is illustrated in FIG. 3. While an example mentioned above is of a 500 kg base and a 50 kg stage, it will be appreciated that the invention is not limited thereto, nor is the 10:1 ratio required.

Figure 6:
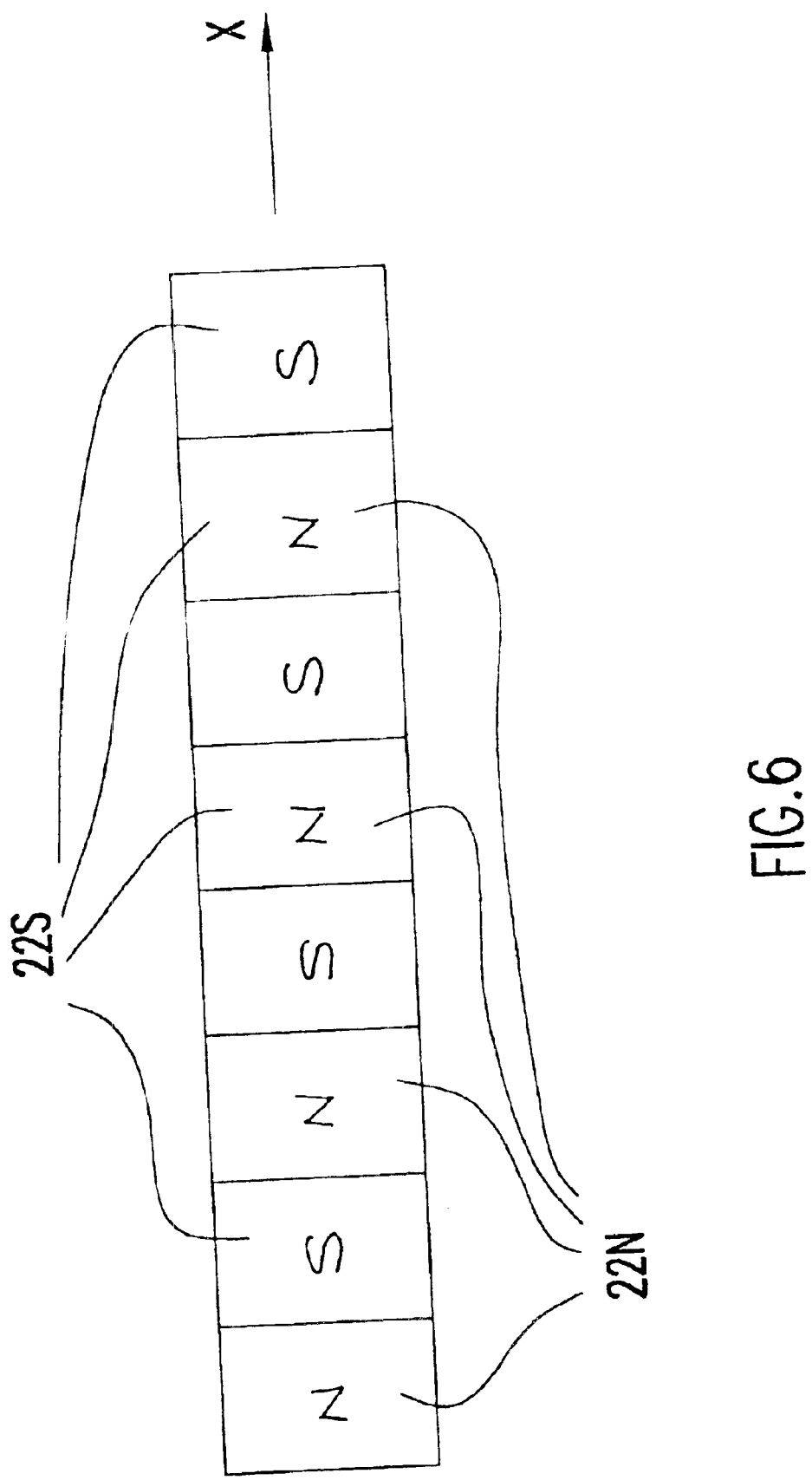
FIG. 6 is a schematic top view of an array of magnets according to the invention.

A preferred embodiment of the invention may use a following stage 3 as shown in FIGS. 2(a) and 2(b). The illustrated following stage 3 has two arms 8 that extend in the y direction and carry y-coils 9 for applying force in the y direction to the stage WS. Preferably, the y-coils 9 are along the length of arm 8. The arms 8 of the following stage 3 are supported on the base 1, such as by air bearings. The following stage 3 is driveable in the x-direction, such as by a linear motor installed on the reaction frame base. Such linear motor technology is well known to those skilled in the art. Such an x linear motor maybe used to drive the following stage 3 to follow the x motion of the wafer stage WS by utilizing a command signal (target position) that is the same as the command signal (target position) used by the x motor. The following stage may be controlled to maintain the gap between the stage WS and the following stage 3 based on the output of a gap sensor (not shown) that detects the information related to the gap. Allowing some relative motion in the x direction between the wafer W and following stage 3 reduces the acceleration required by the following stage 3, and therefore reduces the power consumption of the linear motor. The following stage 3 also carries two permanent magnets 13 (the other is not shown) which extend along the arms 8 in the y direction. These magnets 13 interact with each levitation magnet 10 on the wafer stage WS respectively to provide a levitation force to support the wafer stage WS weight with minimal or no power consumption. In FIG. 2A, a wafer stage WS and accompanying components according to an exemplary form of the invention are shown in an exploded view. The bottom of the stage WS contains permanent magnets 10 (such as levitation magnets) that interact with the magnets 13 on the following stage arms 8 to provide levitation force. The levitation magnets 10 and magnets 13 are shown in one possible configuration in the figure to provide a force on the stage to counteract gravity. Other possibilities also can be used, including air bellows, air bearings, or mechanical springs. Each of the x magnets 11 and y magnets 12 in the figures comprises an array of magnets with alternating polarities. For example, each x magnet array may consist of a plurality of parallel magnets arranged in the x direction as shown in FIG. 6, with alternating parallel north magnets 22N and south magnets 22S.

In FIG. 2A, two x magnets 11 and two y magnets 12 are shown. However, it will be appreciated that the invention is not limited to any particular number of magnets, or pairs of magnets. The top of the wafer stage (WS) is suitable for receiving a wafer (W). An interferometer mirror (IM) is included.

FIG. 4 shows a top view of the inventive apparatus of FIG. 1. Circles W indicate where a wafer may be placed. Arrows indicate the forces produced by respective x and y motors. Forces produced by the x motors are shown as arrows parallel to the x-axis and forces produced by the y motors are shown as arrows parallel to the y-axis. Y coils 19 are provided as indicated.

The number of first magnet arrays and second magnet arrays used in the invention is not particularly limited. Preferably, two first magnet arrays and/or two second magnet arrays may be used. In each case, the pair of magnet arrays interacts with a corresponding coil array to create two parallel linear motors. By differentially driving these motors, torque about the Z axis is created, so the stage is driven in three degrees of freedom (X, Y, and $\theta_z$).

Each of the linear motors formed by a magnet array and its corresponding coil array can also produce a force in the Z direction. By differentially driving pairs of motors to create unequal forces in Z, torques about the X and Y axes may be created. The stages thus may be driven in six independent degrees of freedom (X, Y, Z, $\theta_x$, $\theta_y$, and $\theta_z$).

While above moving magnet assembly motors primarily have been discussed, the invention also includes moving coil motors. In such a moving coil motor embodiment, the coil arrays and magnet arrays are interchanged from their positions in the moving magnet motor embodiment. Particularly, the magnet arrays are in the base and the following stage arm, and the coil arrays are attached to the stage. Thus, a moving coil motor is provided. Also, in an alternate embodiment, a moving magnet may be used for one direction, and a moving coil used for the perpendicular direction.

The invention provides the important advantageous feature that the X reaction forces act on the base. The Y reaction forces after acting on the following stage are transferred to the following stage base. By isolating the base and the following stage base from each other, vibration and disturbance coupling between the X and Y degrees of freedom can be reduced. The two bases optionally may be provided with reaction frames connecting them to the ground (see, e.g., U.S. Pat. No. 5,528,118), or the base and the following stage base optionally can act as countermasses. The disclosure of U.S. Pat. No. 5,528,118 is incorporated herein to the fullest extent permissible. An example of countermass arrangement may be appreciated with respect to FIG. 4. A variable gap t separates the following stage base 3A from the base 1. When the stage WS moves in the +X direction, the reaction force acts on the base 1, and moves it in the −X direction. When the stage WS moves in the +Y direction, the reaction force is transmitted through the following stage 3 to the following stage base 3A, which moves in the −Y direction as a countermass, changing the gap t. For an embodiment with two stages, the two following stage bases can be connected together or not, depending on the details of the design. On base top 1A are provided x-coils as in FIG. 2A, and so that FIG. 4 will be simpler, the x-coils are not drawn again, as they are already shown in FIG. 2A.

Figure 5:
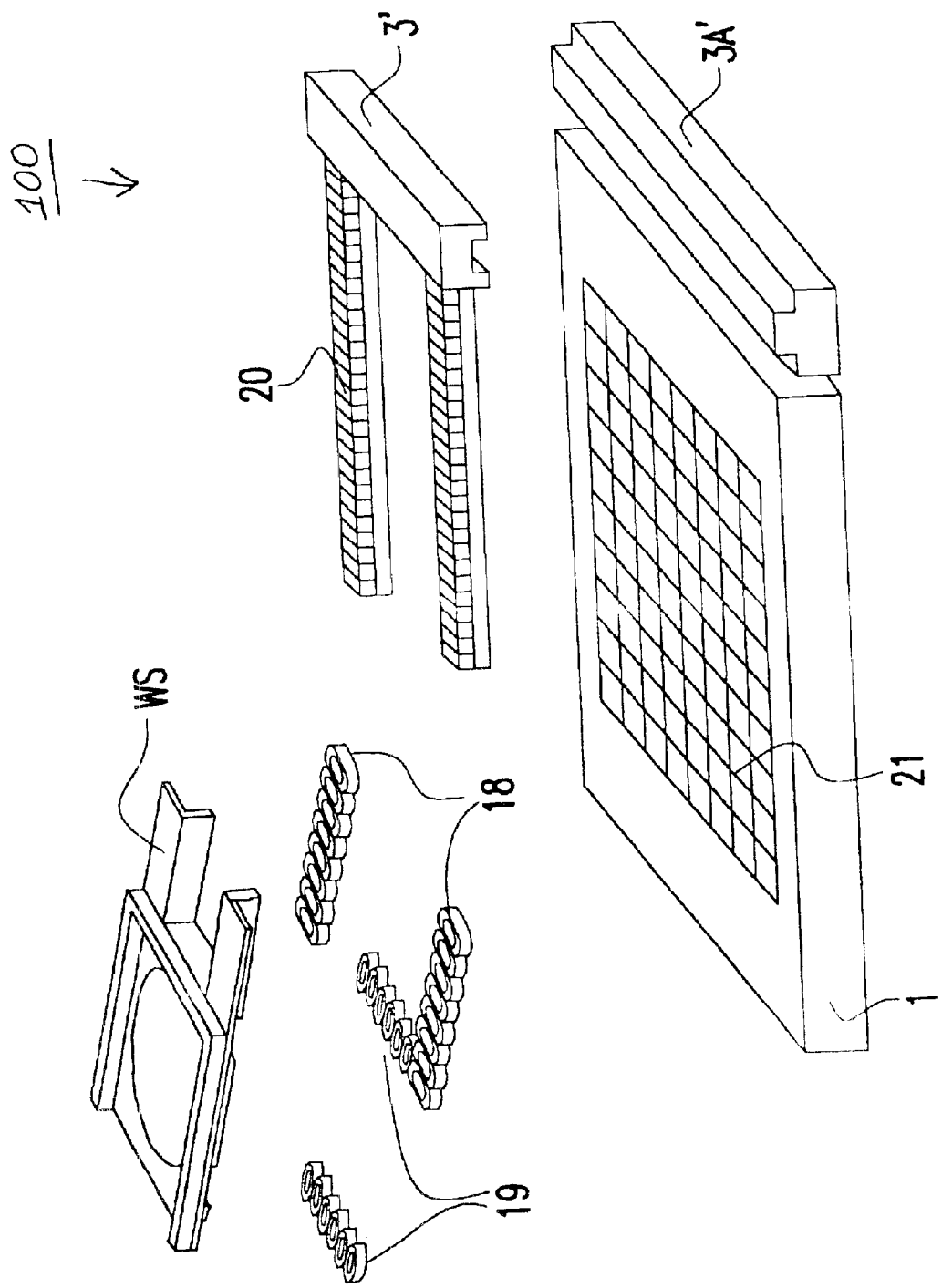
FIG. 5 is an exploded view of a moving coil motor according to the invention.

While FIGS. 1 through 4 depict a moving-magnet embodiment, moving coil configurations also are provided by the invention. An exemplary moving coil motor according to the present invention is shown in FIG. 5. As shown in FIG. 5, under a wafer stage WS, y coils 18 and x coils 19 are provided, preferably in an array with y coils 18 perpendicular to x coils 19. The wafer stage WS, the following stage 3' and the following stage base 3A' in the moving-coil apparatus of FIG. 5 are generally disposed as are the wafer stage WS, following stage 3 and following stage base 3A in the moving-magnet embodiment discussed above with reference to FIGS. 1 through 4. In FIG. 5, the following stage 3' is provided with arms comprising y magnets 20. A plurality of x magnets 21 are embedded in the base 1.

Figure 7:
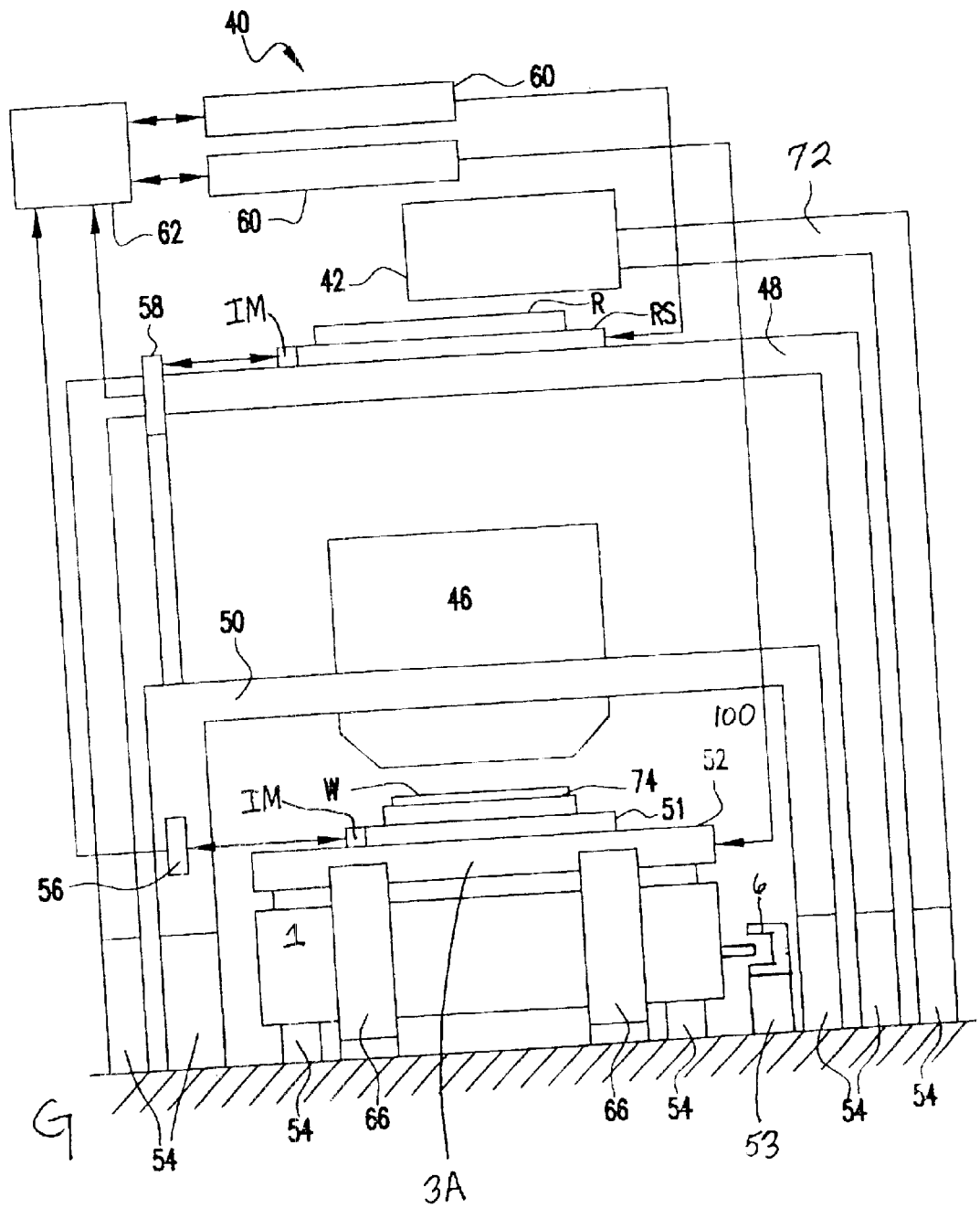
FIG. 7 is a schematic view illustrating a photolithography apparatus according to the invention.

FIG. 7 is a schematic view illustrating a photolithography apparatus (exposure apparatus) 40 incorporating the stage assembly 100 described herein above consistent with the principle invention as a water positioning stage 52. The wafer positioning stage 52 includes a wafer stage 51, a base 1, a following stage 3 (shown in FIGS. 1 and 2A), a following stage base 3A, and an additional actuator 6. The wafer stage 51 comprises a wafer chuck 74 that holds a wafer W and an interferometer mirror IM. The base 1 is supported by a plurality of isolators 54 (or a reaction frame). The isolator 54 may include the gimbal air bearing 7 shown in FIG. 3. The following stage base 3A is supported by a wafer stage frame (reaction frame) 66. The additional actuator 6 is supported on the ground G through a reaction frame 53. The wafer positioning stage 52 is structured so that it can move the wafer stage 51 in multiple (e.g., three to six) degrees of freedom under precision control by a drive control unit 60 and system controller 62, and position the wafer W at a desired position and orientation relative to the projection optics 46. In this embodiment, the wafer stage 51 has six degrees of freedom by utilizing the Z direction forces generated by the x motor and the y motor of the wafer positioning stage 52 to control a leveling of the wafer W. However, a wafer table having three degrees of freedom (Z, $\theta_x$, $\theta_y$) or six degrees of freedom can be attached to the wafer stage 51 to control the leveling of the wafer. The wafer table includes the wafer chuck 74, at least three voice coil motors (not shown), and bearing system. The wafer table is levitated in the vertical plane by the voice coil motors and supported on the wafer stage 51 by the bearing system so that the wafer table can move relative to the wafer stage 51.

The reaction force generated by the wafer stage 51 motion in the X direction can be canceled by the motion of the base 1 and the additional actuator 6. Further, the reaction force generated by the wafer stage 51 motion in the Y direction can be canceled by the motion of the following stage base 3A.

An illumination system 42 is supported by a frame 72. The illumination system 42 projects radiant energy (e.g., light) through a mask pattern on a reticle R that is supported by and scanned using a reticle stage RS. The reaction force generated by motion of the reticle stage RS can be mechanically released to the ground through a reticle stage frame 48 and the isolator 54, in accordance with the structures described in JP Hei 8-330224 and U.S. Pat. No. 5,874,820, the entire contents of which are incorporated by reference herein. The light is focused through a projection optical system (lens assembly) 46 supported on a projection optics frame 50 and released to the ground through isolator 54.

An interferometer 56 is supported on the projection optics frame 50 and detects the position of the wafer stage 51 and outputs the information of the position of the wafer stage 51 to the system controller 62. A second interferometer 58 is supported on the projection optics frame 50 and detects the position of the reticle stage RS and outputs the information of the position to the system controller 62. The system controller 62 controls a drive control unit 60 to position the reticle R at a desired position and orientation relative to the wafer W or the projection optics 46.

There are a number of different types of photolithographic devices. For example, apparatus 40 may comprise an exposure apparatus that can be used as a scanning type photolithography system which exposes the pattern from reticle R onto wafer W with reticle R and wafer W moving synchronously. In a scanning type lithographic device, reticle R is moved perpendicular to an optical axis of projection optics 46 by reticle stage RS and wafer W is moved perpendicular to an optical axis of projection optics 46 by wafer positioning stage 52. Scanning of reticle R and wafer W occurs while reticle R and W are moving synchronously in the x direction.

Alternately, exposure apparatus 40 can be a step-and-repeat type photolithography system that exposes reticle R while reticle R and wafer W are stationary. In the step and repeat process, wafer W is in a constant position relative to reticle R and projection optics 46 during the exposure of an individual field. Subsequently, between consecutive exposure steps, wafer W is consecutively moved by wafer positioning stage 52 perpendicular to the optical axis of projection optics 46 so that the next field of semiconductor wafer W is brought into position relative to projection optics 46 and reticle R for exposure. Following this process, the images on reticle R are sequentially exposed onto the fields of wafer W so that the next field of semiconductor wafer W is brought into position relative to projection optics 46 and reticle R.

However, the use of apparatus 40 provided herein is not limited to a photolithography system for semiconductor manufacturing. Apparatus 40 (e.g., an exposure apparatus), for example can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

In the illumination system 42, the illumination source can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to projection optics 46, when far ultra-violet rays such as the excimer laser is used, glass materials such as quartz and fluorite that transmit far ultra-violet rays are preferably used. When the $F_2$ type laser or x-ray is used, projection optics 46 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japanese Patent Application Disclosure No.10-20195 and its counterpart U.S. Pat. No. 5,835,275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689,377 as well as Japanese Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above-mentioned U.S. patents, as well as the Japanese patent applications published in the Office Gazette for Laid-Open Patent Applications are incorporated herein by reference.

Further, in photolithography systems, when linear motors that differ from the motors shown in the above embodiments (see U.S. Pat. No. 5,623,853 or 5,528,118) are used in one of a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 8:
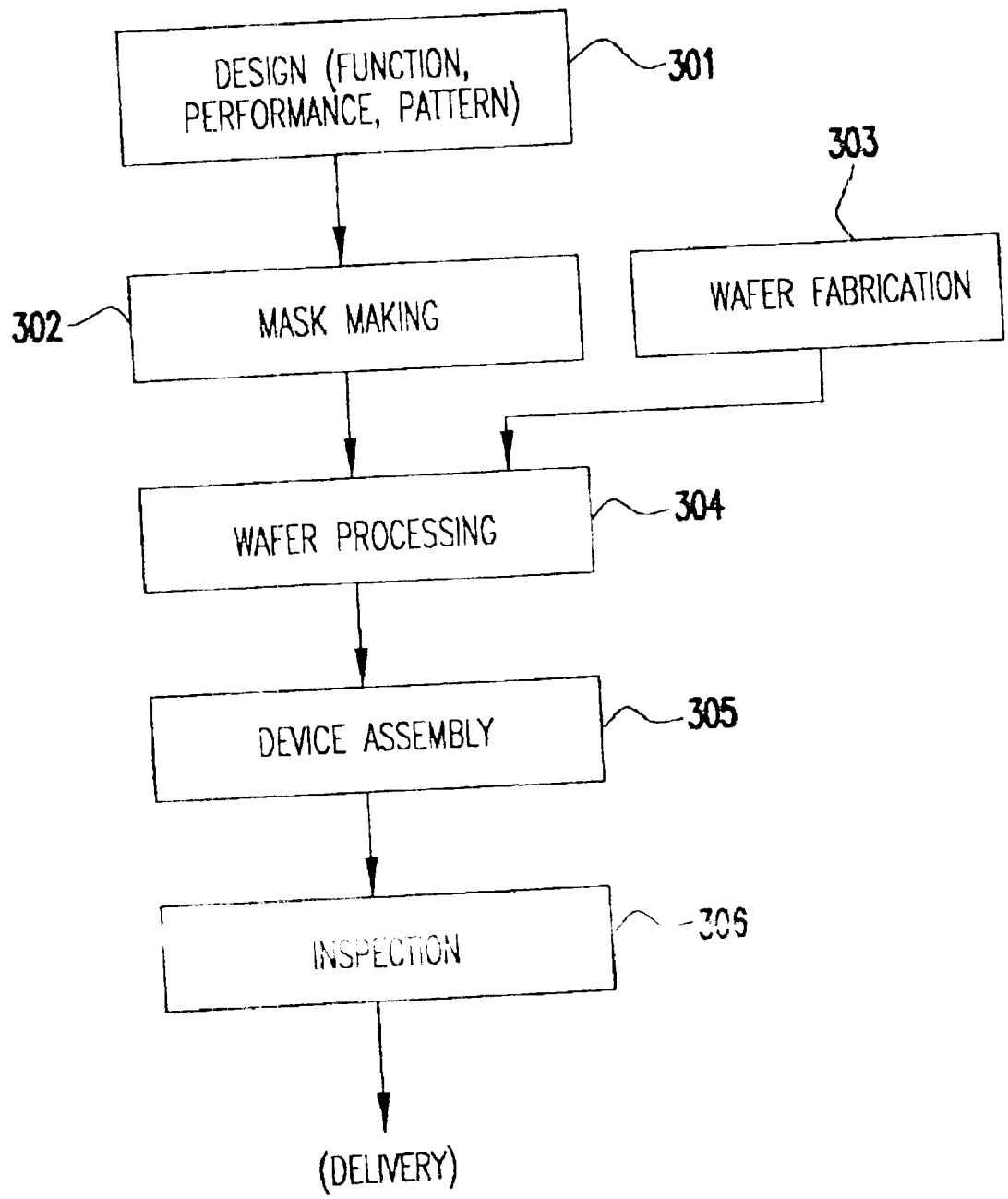
FIG. 8 is flow chart showing semiconductor device fabrication.

Further, semiconductor devices can be fabricated using the above described systems, by the process shown generally in FIG. 8. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 9:
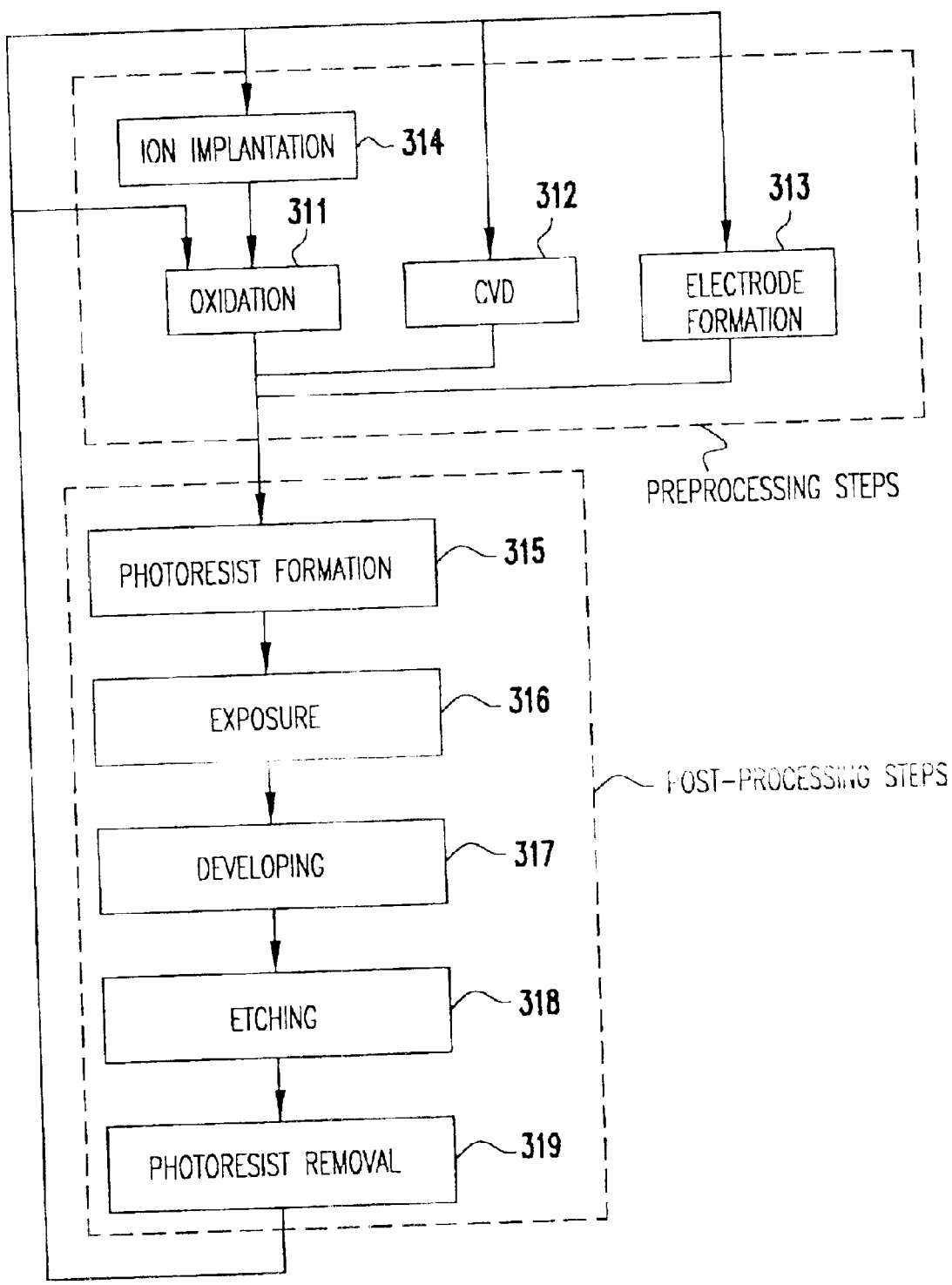
FIG. 9 is a flow chart showing wafer processing.

FIG. 9 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above-mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially in step 315 (photoresist formation step), photoresist is applied to a wafer. Next, in step 316 (exposure step), the above-mentioned exposure apparatus is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these pre-processing and post-processing steps.

The invention was accomplished based, inter alia, on the recognition that separating the x from the y coils may achieve significant advantages. First, such a separated-coil design makes control systems easier, by providing independent control of each coil array so that force may be produced in a given direction, in contrast with conventional planar motors that use the same coil array to produce forces in more than one direction (thus creating coupling between degrees of freedom). Second, by such a design separating x and y coils, reaction forces from the motors advantageously act on separate parts.

The invention advantageously provides decoupling of which motor controls which respective degree of freedom, simplifying control system design. The invention also advantageously provides decoupling of reaction forces in the x and y directions, so that reaction forces from the motors are acting on different bodies (thus facilitating the building of a structure to support the reaction forces and facilitating isolation of disturbances from one part to another). Another advantage of this invention is that in the moving magnet configuration, a monolithic wafer stage can be provided. A further advantage of the present invention is use of separate linear motors to create forces in the x and y directions. For the invention, yet another advantage lies in permitting two wafer stages to move on the same table.

It will be apparent to those skilled in the art that various modifications and variations can be made in the methods described, in the stage device, the control system, the material chosen for the present invention, and in construction of the photolithography systems as well as other aspects of the invention without departing from the scope or spirit of the invention. While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A stage assembly comprising:
a first motor that includes a first part and a second part, the first motor producing a first force;
a second motor that includes a first part and a second part, the second motor producing a second force;
a base to which the first part of the first motor is attached;
a stage to which is attached the second part of the first motor and the second part of the second motor, the stage moving relative to the base by at least one of the first force and the second force; and
a second stage to which the first part of the second motor is attached, wherein
the base and the second stage are different respective bodies, and
the second stage includes at least one arm that extends in the y direction and includes the first part of the second motor for applying force in the y direction to the stage.

2. A stage assembly comprising:
a first motor that includes a first part and a second part, the first motor producing a first force;
a second motor that includes a first part and a second part, the second motor producing a second force;

a base to which the first part of the first motor is attached;

a stage to which is attached the second part of the first motor and the second part of the second motor, the stage moving relative to the base by at least one of the first force and the second force; and a second stage to which the first part of the second motor is attached, wherein the base and the second stage are different respective bodies, the second stage includes at least one arm that extends in the y direction and includes the first part of the second motor for applying force in the y direction to the stage, the first part runs along the length of the at least one arm, and the at least one arm is supported on the base by bearings.

3. A stage assembly comprising:

a first motor that includes a first part and a second part, the first motor producing a first force;

a second motor that includes a first part and a second part, the second motor producing a second force;

a base to which the first part of the first motor is attached;

a stage to which is attached the second part of the first motor and the second part of the second motor, the stage moving relative to the base by at least one of the first force and the second force; and a second stage to which the first part of the second motor is attached, wherein the base and the second stage are different respective bodies, the second stage carries a portion of a levitation device which extends along the at least one arms in the y direction, the stage carries another portion of the levitation device, and the levitation device provides a levitation force to support the stage weight.

4. A stage assembly comprising:

a base member;

a stage that is supported by the base member, the stage being movable relative to the base member;

a ground that supports the base member;

a first driving device connected to the stage and the base member, the first driving device moving the stage along a first direction; and a second driving device connected to the stage, the second driving device moving the stage along a second direction that is different from the first direction, wherein a first reaction force that is generated by the first driving device acts on the base member and moves the base member relative to the ground along the first direction, and wherein a second reaction force that is generated by the second driving device is not transmitted to the base member.

5. The stage assembly of claim 4, wherein the second reaction force is transmitted to a movable member that is isolated from the base member.

6. The stage assembly of claim 5, wherein the movable member is movable relative to the ground as a countermass.

7. The stage assembly of claim 4, further comprising a bearing device that is disposed between the base member and the ground.

8. The stage assembly of claim 7, further comprising an actuator that is connected to the base member, the actuator moving the base member along the first direction.

9. The stage assembly of claim 4, wherein the base member moves in a direction opposite to the direction of the movement of the stage along the first direction.

10. An exposure apparatus, comprising:

an illumination system that irradiates radiant energy; and the stage assembly according to claim 4, the stage assembly disposing an object on a path at the radiant energy.

11. A device manufactured with the exposure apparatus of claim 10.

12. A wafer on which an image has been formed by the exposure apparatus of claim 10.

13. A stage assembly, comprising:

a base member;

a stage that is supported by the base member, the stage being movable relative to the base member;

a movable member that is isolated from the base member and movable relative to the stage;

a first driving device connected to the stage and the base member, the first driving device moving the stage along a first direction; and a second driving device connected to the stage and the movable member, the second driving device moving the stage along a second direction that is different from the first direction, wherein a first reaction force that is generated by the stage motion along the first direction is canceled by utilizing the motion of the base member and a second reaction force that is generated by the stage motion along the second direction is cancelled by utilizing the motion of the movable member.

14. The stage assembly of claim 13, wherein:

the first driving device includes a first part connected to the stage and a second part connected to the base member; and the second driving device includes a first part connected to the stage and a second part connected to the movable member.

15. The stage assembly of claim 13, further comprising a bearing device that supports the base member movably.

16. The stage assembly of claim 15, further comprising an actuator that is connected to the base member, the actuator moving the base member along the first direction.

* * * * *